United States Patent
Tian et al.

(10) Patent No.: US 10,165,708 B2
(45) Date of Patent: Dec. 25, 2018

(54) COOLING MECHANISM USED INSIDE GIMBAL

(71) Applicant: Haoxiang Electric Energy (Kunshan) Co., Ltd., Kunshan, Jiangsu (CN)

(72) Inventors: Yu Tian, Jiangsu (CN); Wenyan Jiang, Jiangsu (CN)

(73) Assignee: Haoxiang Electric Energy (Kunshan) Co., Ltd., Kunshan, Jiangsu (CN)

( * ) Notice: Subject to any disclaimer, the term of this patent is extended or adjusted under 35 U.S.C. 154(b) by 0 days.

(21) Appl. No.: 15/854,768

(22) Filed: Dec. 27, 2017

(65) Prior Publication Data

US 2018/0139866 A1    May 17, 2018

(30) Foreign Application Priority Data

Dec. 29, 2016   (CN) .................... 2016 2 1462355 U
Dec. 29, 2016   (CN) .................... 2016 2 1462488 U

(51) Int. Cl.
  *H05K 7/20*   (2006.01)
  *H05K 1/02*   (2006.01)
  *H05K 5/00*   (2006.01)
  *H05K 5/06*   (2006.01)

(52) U.S. Cl.
  CPC ....... *H05K 7/20263* (2013.01); *H05K 1/0203* (2013.01); *H05K 5/0056* (2013.01); *H05K 5/061* (2013.01); *H05K 2201/064* (2013.01)

(58) Field of Classification Search
  CPC ............ H05K 7/20263; H05K 1/0203; H05K 5/0056; H05K 5/061
  USPC ........................................ 361/699, 719, 720
  See application file for complete search history.

(56) References Cited

U.S. PATENT DOCUMENTS

| | | | | |
|---|---|---|---|---|
| 5,841,634 A * | 11/1998 | Visser | ....................... | F28F 3/12 361/699 |
| 6,052,284 A * | 4/2000 | Suga | ..................... | H01L 23/473 165/80.4 |
| 6,304,447 B1 * | 10/2001 | Bortolini | ............ | H05K 7/20236 165/104.33 |
| 8,369,090 B2 * | 2/2013 | Chester | .............. | H05K 7/20772 361/699 |

* cited by examiner

*Primary Examiner* — Mukund G Patel

(57) ABSTRACT

A cooling mechanism used inside a gimbal includes a heat dissipating module, a main board and fasteners. The main board is fixed to a lower surface of the heat dissipating module through the fasteners. The main board includes a main chip. The heat dissipating module includes an upper sealing cover; a lower sealing cover fixedly connected to the upper sealing cover, wherein a lower surface of the lower sealing cover has a hole for accommodating the main chip; an air storehouse, wherein a bottom surface of the air storehouse contacts with the main chip, a side surface of the air storehouse is adjacent to a cooling chamber; and sealing rings located between the upper sealing cover and the lower sealing cover. A cooling chamber is formed by the upper sealing cover, the lower sealing cover and a baffle, the cooling liquid is provided in the cooling chamber.

18 Claims, 5 Drawing Sheets

COOLING MECHANISM USED INSIDE GIMBAL

CROSS REFERENCE OF RELATED APPLICATION

The present invention claims priority under 35 U.S.C. 119(a-d) to CN 201621462355.3, filed Dec. 29, 2016, and CN 201621462488.0, filed Dec. 29, 2016.

BACKGROUND OF THE PRESENT INVENTION

Field of Invention

The present invention relates to the field of UAV (unmanned aerial vehicle), and more particularly to a cooling mechanism used inside a gimbal.

Description of Related Arts

When the UAV (unmanned aerial vehicle) with the gimbal is used for a long time, the main chip mounted on the gimbal will generate a large amount of heat, which needs to be dissipated in time. Otherwise, the main chip may be easily burned, which may affect the usage of UAV and shorten the service life thereof, and also increase maintenance costs. In the prior art, heat sinks and fans are mainly used to reduce the temperature of the main chip. However, in this mode, the fans generate vibration and noise, which is unfavorable to the shooting of the camera and affects the recording function of the UAV.

Therefore, there is still a lack in the field of the cooling mechanism which can not only radiate the heat generated by the main chip, but also avoid vibration and noise caused by the heat dissipating device, so as to optimize the shooting effect and the recording function of the UAV.

SUMMARY OF THE PRESENT INVENTION

An object of the present invention is to provide a cooling mechanism used inside a gimbal, which is able to not only effectively dissipate heat generated by a main chip, but also avoid vibration and noise caused by a heat dissipating device, so as to further optimize a shooting effect and a recording function of the UAV.

The present invention provides a cooling mechanism used inside a gimbal, which comprises a heat dissipating module, a main board and fasteners, wherein:

the main board is fixed to a lower surface of the heat dissipating module through the fasteners, the main board comprises a main chip, the heat dissipating module comprises:

an upper sealing cover;

a lower sealing cover which is fixedly connected to the upper sealing cover, wherein a lower surface of the lower sealing cover has a hole for accommodating the main chip;

an air storehouse, wherein a bottom surface of the air storehouse contacts with the main chip, a side surface of the air storehouse is adjacent to a cooling chamber; and sealing rings which are located between the upper sealing cover and the lower sealing cover for sealing a cooling liquid, wherein the cooling chamber is closed and is formed by the upper sealing cover, the lower sealing cover and a baffle, the cooling liquid is provided in the cooling chamber.

Preferably, the fasteners are fixed screws.

Preferably, the air storehouse is closed.

Preferably, the air storehouse is communicated with atmosphere.

Preferably, the upper sealing cover is a housing with semi-enclosed structure.

Preferably, the upper sealing cover is an arched housing.

Preferably, the upper sealing cover is a metal housing and the lower sealing cover is a metal plate.

Preferably, the cooling liquid has large specific heat capacity and non-conductivity.

Preferably, a volume of the cooling liquid is 70%-100% of a volume of the cooling chamber.

Preferably, an amount of the sealing rings is two, one sealing ring is adapted for sealing an outer circle of the cooling chamber, and the other sealing ring is adapted for sealing an inner circle of the cooling chamber.

Preferably, a ratio of an area of the hole to that of the main chip is in a range of 1.0 to 1.5.

Preferably, a ratio of a bottom area of the air storehouse to an area of the hole in the lower sealing cover is in a range of 1.1 to 1.8.

Preferably, there are four fixed screws which are adapted for fixing the lower sealing cover with the upper sealing cover, and both the upper sealing cover and the lower sealing cover have screw holes.

Preferably, there are four fixed screws which are adapted for fixing the main board with the lower sealing cover, both the main board and the lower sealing cover have screw holes.

Preferably, an upper surface of the air storehouse is sealed by the upper sealing cover.

Preferably, an upper surface of the air storehouse is sealed by the cooling chamber.

Preferably, a whole upper surface of the air storehouse is exposed to air.

Preferably, the upper sealing cover has an air hole, and an upper surface of the air storehouse is communicated with atmosphere through the air hole.

Preferably, the upper sealing cover is a cuboid.

Preferably, the baffle is a metal plate.

Preferably, one end of the baffle is fixedly connected with the upper sealing cover, and the other end of the baffle is connected with the lower sealing cover through the sealing rings.

Preferably, the upper sealing cover which contacts with the cooling chamber has an opening through which the cooling liquid flows into or out of the cooling chamber, and the opening is able to closed or opened.

Also, the present invention provides a cooling mechanism used inside a gimbal, comprising:

an upper housing;

a lower cover plate which matches with the upper housing, wherein a cooling chamber is formed between the upper housing and the lower cover plate for storing a cooling liquid;

fasteners through which the lower cover plate is fixed to the upper housing;

a circuit board located in the cooling chamber;

a fixed device which is located inside the cooling chamber and is fixedly connected to the upper housing and/or the lower cover plate for fixing the circuit board; and a sealing component which comprises a sealing ring and a sealing sleeve for sealing the cooling chamber, wherein the sealing ring is located between the upper housing and the lower cover plate, the sealing sleeve is located between the circuit board and the lower cover plate.

Main advantages of the present invention are as follows.

(1) The present invention is able to effectively reduce the temperature of the main chip.

(2) The present invention does not generate vibration itself.

(3) The present invention does not generate noise itself.

(4) The present invention is long in service life.

Therefore, the present invention is able to not only effectively dissipate heat generated by the main chip to reduce the temperature of the main chip, but also avoid vibration and noise caused by the heat dissipating device, so as to further optimize the shooting effect and the recording function of the UAV.

It should be understood that, within the scope of the present invention, each technical feature of the present invention described above and various technical features described in the following (as embodiments) may be combined with each other to form a new or preferred technical solution. Due to space limitations, no description is provided again here.

BRIEF DESCRIPTION OF THE DRAWINGS

To describe the technical solutions in the embodiments of the present invention or in the prior art more clearly, the accompanying drawings required for describing the embodiments or the prior art are briefly introduced as follows. Apparently, the accompanying drawings in the following description merely show some embodiments of the present invention; and for those skilled in the art, other drawings can also be obtained according to these drawings without any creative efforts.

Figure 1:
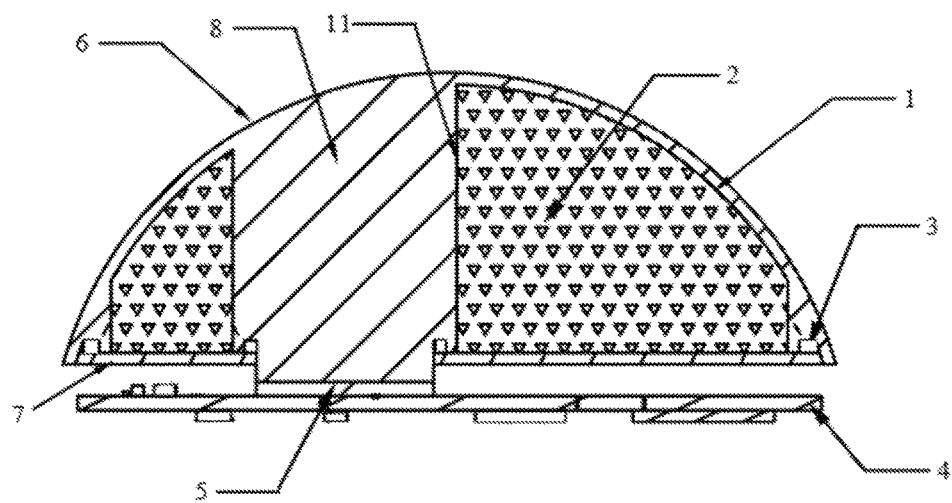
FIG. 1 is a cross-sectional view of a cooling mechanism according to a first preferred embodiment of the present invention.

In the drawings, 1: cooling chamber; 2: cooling liquid; 3: sealing ring; 4: main board; 5: main chip; 6: upper sealing cover; 7: lower sealing cover; 8: air storehouse; 9: fixed screw; 10: heat dissipating module; 11: baffle; 12: upper housing; 13: lower cover plate; 15: circuit board; 16: sealing sleeve; 17: chip interface; 18: accommodating hole; 19: fixed connecting component; 20: upper housing connector; 21: circuit board connector; 22: lower cover plate connector; 23: hole; 24 screw hole column; 25: screw hole.

DETAILED DESCRIPTION OF THE PREFERRED EMBODIMENT

After extensive and intensive research, the present inventor has developed a cooling mechanism used inside a gimbal by extensive screening for the first time. The cooling mechanism of the present invention has a specific structure. Compared with the prior art, the cooling mechanism of the present invention effectively dissipates heat generated by a main chip by a liquid cooling method, and further avoids the disadvantages of vibration and noise caused by heat dissipating devices such as fans, so as to further optimize the shooting effect and the recording function of the UAV. Based on the principle mentioned above, the present invention has been completed.

The present invention is further described below with reference to specific embodiments. It should be understood that these embodiments are only for illustrating the present invention and are not intended to limit the scope of the present invention. In addition, the drawings are schematic diagrams, and thus the apparatus and equipment of the present invention are not limited by the size or scale of the schematic diagrams.

It should be understood that in the claims and the specification of the present invention, the relationship terms such as first and second are only intended to distinguish one entity or operation from another entity or operation, and does not necessarily require or imply that any actual relationship or sequence exists between these entities or operations. Moreover, terms "comprise" and "include" or other any variants are intended to cover non-exclusive inclusions, so that processes, methods, apparatus or articles which include a series of elements not only include these elements, but also include other elements which are not explicitly listed, or include the inherent elements of the processes, methods, apparatuses or articles. In the absence of more restrictions, elements defined by the phrase "include a" do not exclude the existence of additional identical elements in the processes, methods, article, or apparatus that include the elements.

First Embodiment

Referring to FIGS. 1 to 4, a cooling mechanism used inside a gimbal according to a first embodiment of the present invention is illustrated.

Figure 2:
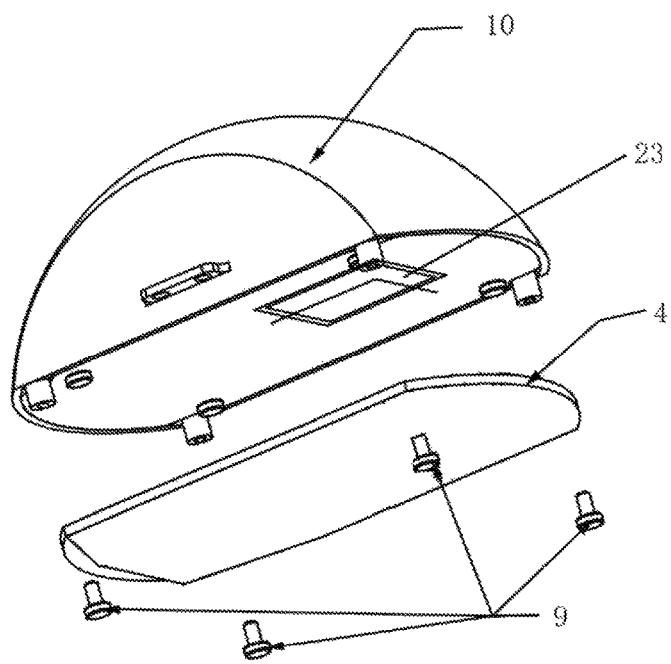
FIG. 2 is an exploded view of the cooling mechanism according to the first preferred embodiment of the present invention.
Figure 3:
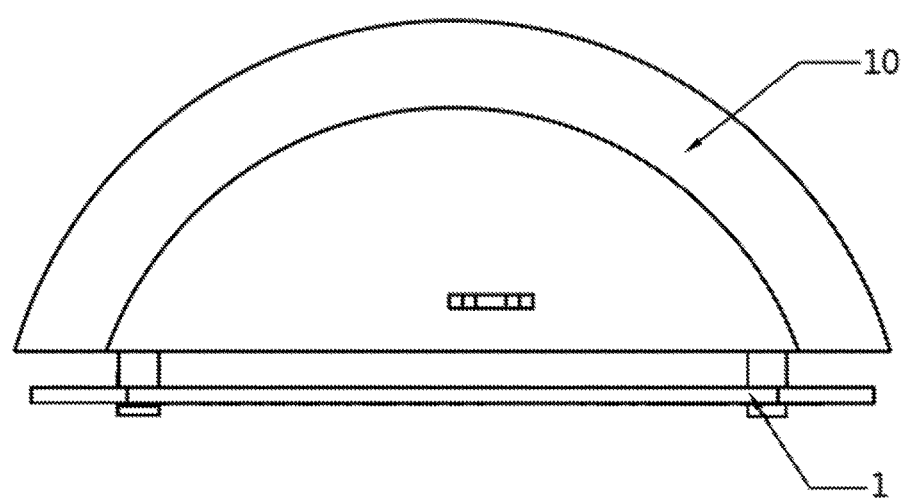
FIG. 3 is an assembling diagram of the cooling mechanism according to the first preferred embodiment of the present invention.

As shown in FIGS. 2 and 3, the cooling mechanism comprises a heat dissipating module 10, a main board 4 and fixed screws 9, wherein both the main board 4 and a lower sealing cover 7 have screw holes, the main board 4 is fixed to a lower surface of the heat dissipating module 10 through four fixed screws 9, a size of the main board 4 is slightly smaller than that of the lower sealing cover 7 for obtaining better fixing and cooling effects.

Furthermore, in the first embodiment of the present invention, the main board 4 is able to be fixed to the lower surface of the heat dissipating module 10 through other manners. For example, the main board 4 is bonded and fixed with the lower surface of the heat dissipating module 10 through fixing glue; or the main board 4 is fixed with the lower surface of the heat dissipating module 10 through a buckle which is made of plastic or metal. The implementation of these manners is all well-known to those skilled in the art, and thus will not be described in detail herein.

Figure 4:
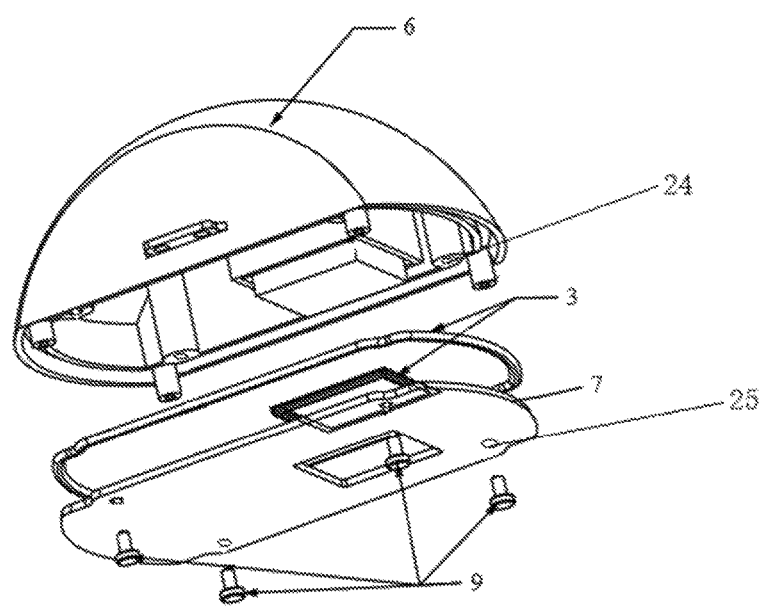
FIG. 4 is an exploded view of a heat dissipating module according to the first preferred embodiment of the present invention.

Referring to FIG. 1 and FIG. 4, the heat dissipating module 10 comprises an upper sealing cover 6, a lower sealing cover 7, an air storehouse 8 and sealing rings 3. Moreover, the main board 4 comprises a main chip 5 which is a core of the main board 4 and acts as a bridge for communicating a processor with surrounding devices. For the main board 4, the main chip 5 affects the performance of the whole structure. Therefore, the main chip 5 is a key of the main board 4. If the main chip 5 is unable to effectively dissipate heat, the normal work and the performance of the whole structure are affected.

The upper sealing cover 6 is an arched housing with semi-enclosed structure. Both the upper sealing cover 6 and the lower sealing cover 7 have screw holes. The lower sealing cover 7 is fixed to the upper sealing cover 6 through the four fixed screws 9. A lower surface of the lower sealing cover 7 has a hole 23 for accommodating the main chip 5. The hole 23 matches with the main chip 5. A ratio of an area of the hole 23 to that of the main chip 5 is in a range of 1.0 to 1.5, and preferably 1.1.

Furthermore, in the first embodiment of the present invention, the upper sealing cover 6 is able to be a housing in other forms, such as cuboid and cube.

The upper sealing cover 6, the lower sealing cover 7 and a baffle 11 form a closed cooling chamber 1, wherein one end of the baffle 11 is fixedly connected with the upper sealing cover 6, the other end of the baffle 11 is connected with the lower sealing cover 7 through the sealing rings 3. The cooling chamber 1 stores a cooling liquid 2. The cooling liquid 2 is a liquid with large specific heat capacity and non-conductivity. A volume of the cooling liquid 2 is 70%-100% of a volume of the cooling chamber 1, and preferably 85%-100%, and more preferably 100%.

More specifically, in the first embodiment of the present invention, the cooling liquid comprises water, anti-freezing agent and additive. According to the anti-freezing agents with different components, the cooling liquid is divided into three categories: ethyl alcohol type, glycerinum type and ethylene glycol type.

A bottom surface of the air storehouse 8 contacts with the main chip 5, a ratio of a bottom area of the air storehouse 8 to an area of the hole in the lower sealing cover 7 is in a range of 1.1 to 1.8, and preferably 1.4 to 1.5. A side surface of the air storehouse 8 contacts with the baffle 11. A whole upper surface of the air storehouse 8 is exposed to air and communicated with atmosphere, in such a manner that the main chip 5 which contacts with the bottom surface of the air chamber 8 dissipates heat through the air storehouse 8, the air in the air storehouse 8 is cooled down through the cooling liquid 2 in the cooling chamber 1 which surrounds the side surface of the air storehouse 8; and simultaneously, a small part of the heat from the main chip 5 are transferred to the cooling liquid 2 through heat radiation, so as to decrease a temperature of the main chip 5. The sealing rings 3 are located between the upper sealing cover 6 and the lower sealing cover 7 for sealing the cooling liquid 2. An amount of the sealing rings 3 is two, one sealing ring 3 is adapted for sealing an outer ring of the cooling chamber 1, and the other sealing ring 3 is adapted for sealing an inner ring of the cooling chamber 1.

Moreover, all of the upper sealing cover 6, the lower sealing cover 7 and the baffle 11 are made of metal, such as stainless steel and aluminum.

Furthermore, in the first embodiment of the present invention, there may be further modifications. For example, the air storehouse 8 is able to be closed or communicated with atmosphere.

Preferably, the upper surface of the air storehouse 8 is sealed by the upper sealing cover 6, or the cooling chamber 1.

Preferably, a whole upper surface of the air storehouse 8 is exposed to air, or the upper sealing cover 6 has an air hole, the upper surface of the air chamber 8 is communicated with atmosphere through the air hole.

In the cooling mechanism used inside the gimbal according to the first embodiment of the present invention, the upper sealing cover which contacts with the cooling chamber has an opening through which the cooling liquid flows out of or into the cooling chamber, the opening is able to be closed or opened.

Second Embodiment

Figure 5:
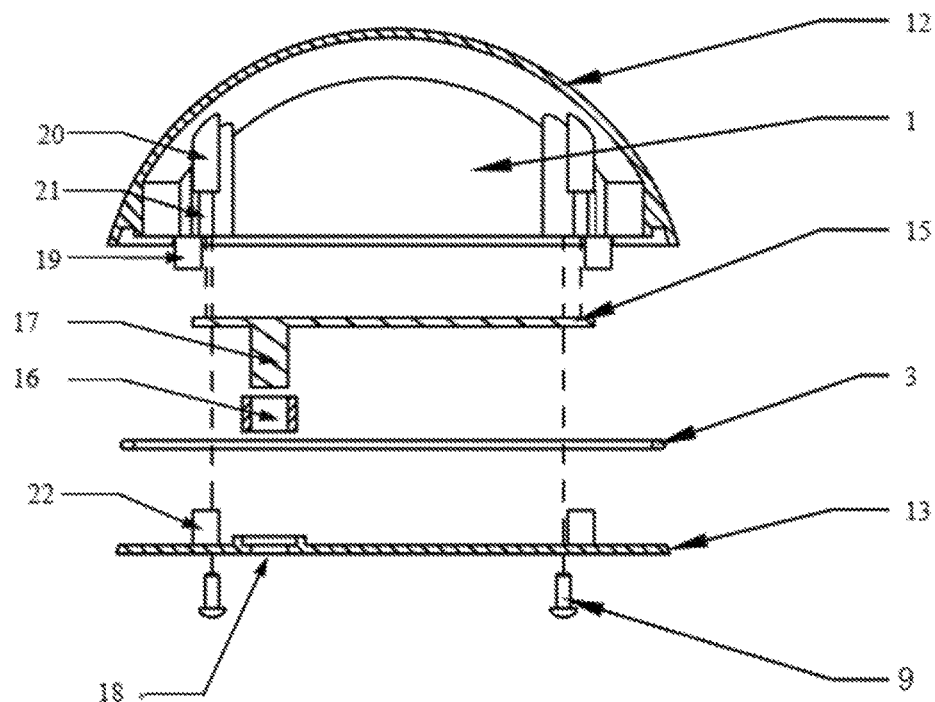
FIG. 5 is structurally decomposition diagram of components of a cooling mechanism according to a second preferred embodiment of the present invention.
Figure 6:
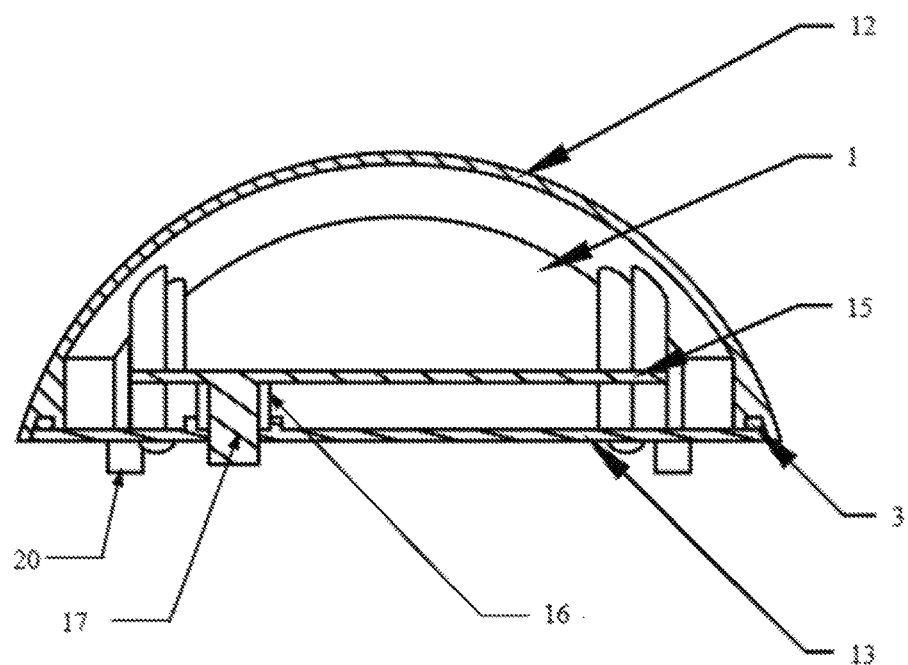
FIG. 6 is a cross-sectional view of the cooling mechanism according to the second preferred embodiment of the present invention.
Figure 7:
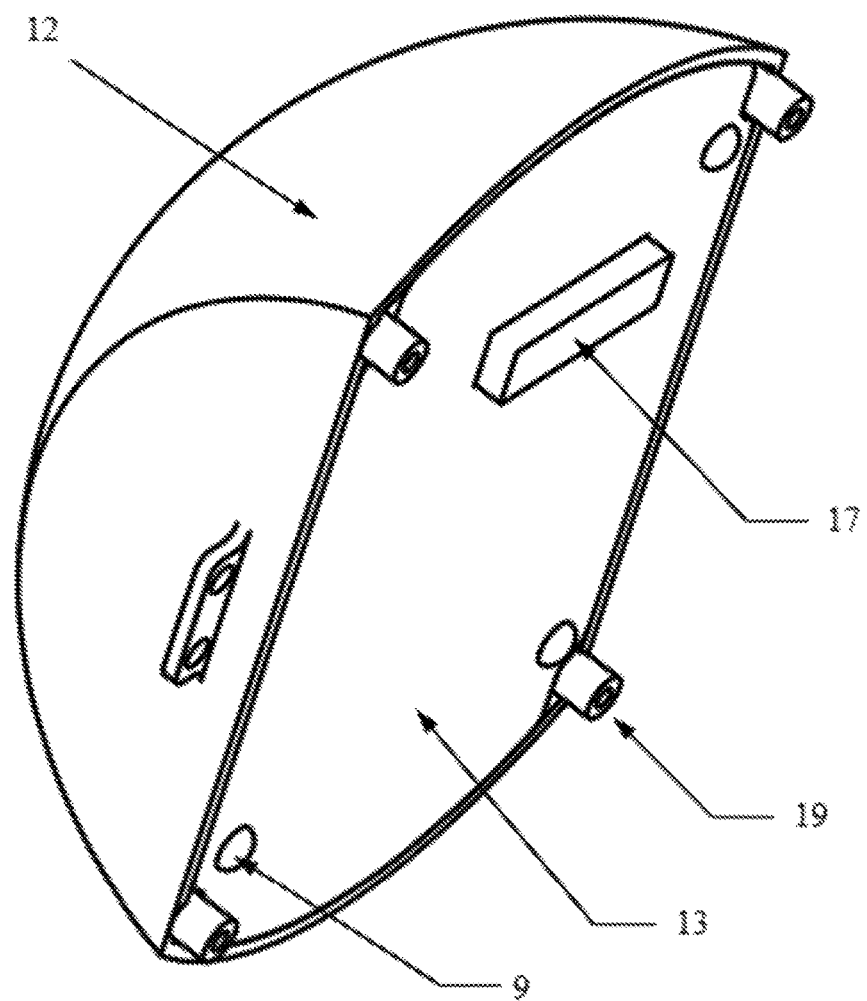
FIG. 7 is a perspective view of the cooling mechanism according to the second preferred embodiment of the present invention.

Referring to FIGS. 5 to 7, a cooling mechanism used inside a gimbal according to a second embodiment of the present invention is illustrated, which comprises an upper housing 12, a lower cover plate 13, fixed screws 9, a circuit board 15, a fixed device and a sealing component. The upper housing 12 is a metal housing, the lower cover plate 13 is a metal plate, and an area of the lower cover plate 13 is slightly smaller than a bottom area of the upper housing 12. The upper housing 12 is an arched housing with semi-enclosed structure. Screw hole columns 24 are located inside the upper housing 12. The lower cover plate 13 matches with the upper housing 12; a cavity is formed therebetween, namely, a cooling chamber 1 is formed, for storing a cooling liquid which is an insulation liquid with large specific heat capacity. In the second embodiment of the present invention, the cooling chamber 1 is full of the cooling liquid, and the lower cover plate 13 has screw holes 25 and an accommodating hole 18. The fixed screws 9 and the screw hole columns 24 match with the screw holes 25, an amount of all of the fixed screws 9, the screw holes 25 and the screw hole columns 24 is four, and three of which are respectively located at four corners of the cooling mechanism. The fixed screws 9 passes through the screw holes 25 to fixedly connect with the screw hole columns 24 respectively, so as to fasten the lower cover plate 13 to the upper housing 12. The circuit board 15 comprises a chip and is located in a middle of the cooling chamber 1 to directly contact with the cooling liquid, so as to more quickly dissipate the heat of the circuit board 15. The circuit board 15 comprises a chip interface 17 which matches with the accommodating hole 18. The chip interface 17 passes through the accommodating hole 18 to extend out of the cooling chamber 1 for being connected with the circuit board 15. The fixed device is located inside the cooling chamber 1, and fixedly connected with the upper housing 12 and the lower cover plate 13 for fixing the circuit board 15. The sealing component comprises a sealing ring 3 and a sealing sleeve 16 for sealing the sealing chamber 1, wherein the sealing ring 3 is located between the upper housing 12 and the lower cover plate 13, and the sealing sleeve 16 is located between the circuit board 15 and the lower cover plate 13.

The fixed device comprises an upper housing connector 20, a lower housing connector 22 and a circuit board connector 21. The circuit board 15 has four holes. The upper housing connector 20 comprises four cylindrical sub-connectors, one end of every cylindrical sub-connector is connected with the upper housing 12, and the other end thereof is fixedly connected with the circuit board connector 21. The circuit board connector 21 comprises four cylindrical sub-connectors, one end of every cylindrical sub-connector is connected with the upper housing connector 20, and the other end thereof is connected with the lower cover plate connector 22. A cross-sectional area of every cylindrical sub-connector of the circuit board connector 21 is smaller than that of the upper housing connector 20. The cylindrical sub-connectors of the circuit board connector 21 respectively match with the holes in the circuit board 15, the cylindrical sub-connectors pass through the holes in the circuit board 15, and a height of the four cylindrical sub-connectors of the circuit board connector 21 is larger than that of the circuit board 15. The lower cover plate connector 22 comprises four cylindrical sub-connectors, one end of every cylindrical sub-connector is connected with the lower cover plate 13, the other end of the cylindrical sub-connector has a cylindrical hole, the cylindrical hole matches with every cylindrical sub-connector of the circuit board connector 21, every cylindrical sub-connector of the circuit board connector 21 is able to be inserted into the cylindrical hole of the lower cover plate 22, a cross-sectional area of every cylindrical sub-connector of the lower cover plate connector 22 is as same as that of the upper housing connector 20. The circuit board 15 is inserted into four cylindrical sub-connectors of the circuit board connector 21 through four holes in the circuit board 15, and then four portions of the four cylindrical sub-connectors of the circuit board connector 21 which protrude the circuit board 15 are respectively inserted into the cylindrical holes of the four cylindrical sub-connectors of the lower cover plate connector 22, so as to fix the circuit board 15 between the upper housing 12 and the lower cover plate 13.

Moreover, a circle of protruding portion is located at the upper surface of the lower cover plate 13 and around a periphery of the accommodating hole 18, an inner edge surface of the protruding portion is fitted with an outer edge surface of the sealing sleeve 16 for fixing the sealing sleeve 16 and improving the sealing effect of the cooling chamber 1. A fixed connector 19 is located at the back surface of the lower cover plate 13. The fixed connector 19 comprises four screw hole columns which is able to fix the cooling mechanism inside the gimbal through screws.

Figure 8:
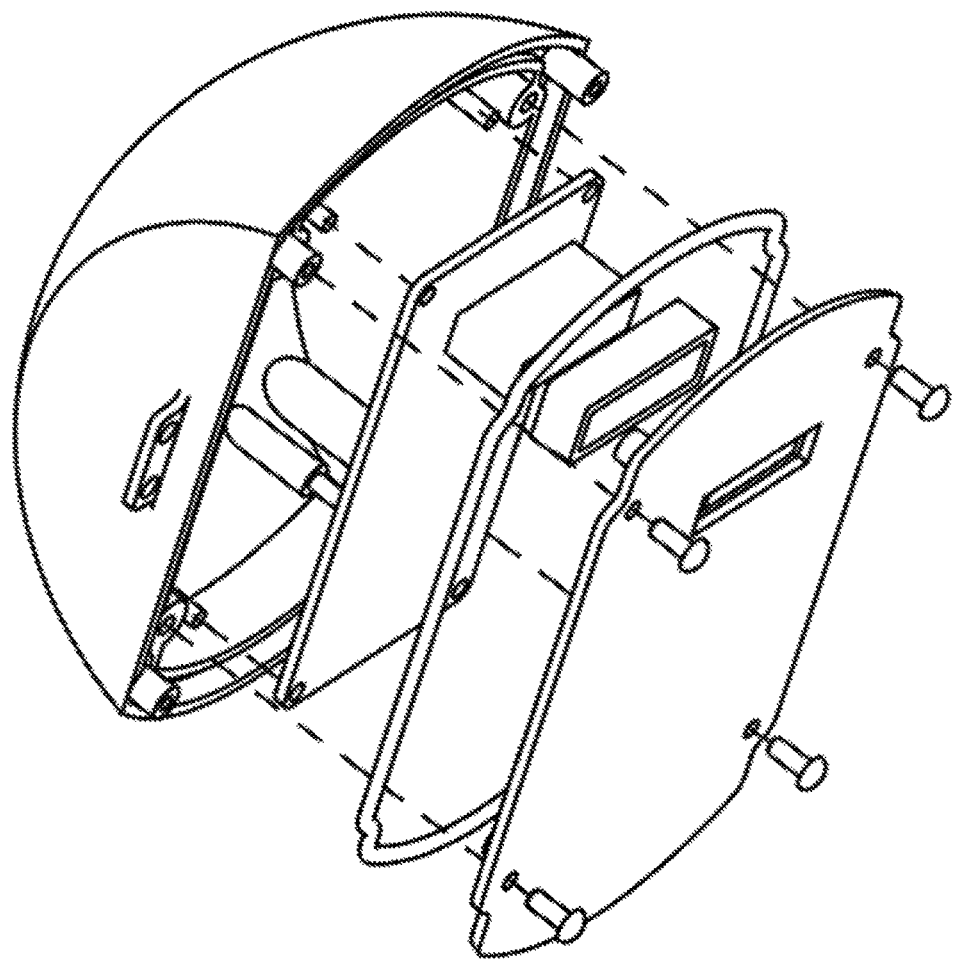
FIG. 8 is an exploded view of the cooling mechanism according to the second preferred embodiment of the present invention.

As shown in FIG. 8, in the cooling mechanism inside the gimbal according to the second embodiment of the present invention, the fixed connector 19 is located at the bottom surface of the lower cover plate 13.

In the cooling mechanism inside the gimbal according to the second embodiment of the present invention, the upper housing 12 has an opening through which the cooling liquid is able to flow out of or into the cooling chamber, and the opening is able to be closed or opened.

Moreover, in the cooling mechanism inside the gimbal according to the second embodiment of the present invention, a contact surface of the upper housing 12 and the lower cover plate 13 has a groove, a protruding component is located on a contact surface of the lower cover plate 13 and the upper housing 12, wherein the groove matches with the protruding component, the sealing ring 3 comprises a concave convex portion for matching with the groove and the protruding component, which has better sealing performance at the contact surface between the upper housing 12 and the lower cover plate 13.

All references mentioned in the present application are incorporated herein by reference, as if each reference was individually incorporated by reference. In addition, it should be understood that after reading the above teachings of the present invention, those skilled in the art can make various modifications or changes to the present invention, and these equivalent forms also fall within the scope of the appended claims of the present application.

What is claimed is:

1. A cooling mechanism used inside a gimbal, comprising a heat dissipating module, a main board and fasteners, wherein the main board is fixed to a lower surface of the heat dissipating module through the fasteners, the main board comprises a main chip, the heat dissipating module comprises:

an upper sealing cover;
a lower sealing cover which is fixedly connected to the upper sealing cover, wherein a lower surface of the lower sealing cover has a hole for accommodating the main chip;
an air storehouse, wherein a bottom surface of the air storehouse contacts with the main chip, a side surface of the air storehouse is adjacent to a cooling chamber; and
sealing rings which are located between the upper sealing cover and the lower sealing cover for sealing a cooling liquid, wherein a cooling chamber is formed by the upper sealing cover, the lower sealing cover and a baffle, the cooling liquid is provided in the cooling chamber.

2. The cooling mechanism, as recited in claim 1, wherein the air storehouse is closed.

3. The cooling mechanism, as recited in claim 1, wherein the air storehouse is communicated with atmosphere.

4. The cooling mechanism, as recited in claim 1, wherein the upper sealing cover is a housing with semi-enclosed structure.

5. The cooling mechanism, as recited in claim 1, wherein the upper sealing cover is a metal housing and a lower sealing cover is a metal plate.

6. The cooling mechanism, as recited in claim 1, wherein the cooling liquid is an insulating cooling liquid.

7. The cooling mechanism, as recited in claim 1, wherein a volume of the cooling liquid is 70%-100% of a volume of the cooling chamber.

8. The cooling mechanism, as recited in claim 1, wherein an amount of the sealing rings is two, one sealing ring is adapted for sealing an outer circle of the cooling chamber, and the other sealing ring is adapted for sealing an inner circle of the cooling chamber.

9. The cooling mechanism, as recited in claim 1, wherein a ratio of an area of the hole to that of the main chip is in a range of 1.0 to 1.5.

10. The cooling mechanism, as recited in claim 1, wherein a ratio of a bottom area of the air storehouse to an area of the hole in the lower sealing cover is in a range of 1.1 to 1.8.

11. A cooling mechanism used inside a gimbal, comprising:

an upper housing;
a lower cover plate which matches with the upper housing, wherein a cooling chamber is formed between the upper housing and the lower cover plate for storing a cooling liquid;
fasteners through which the lower cover plate is fixed to the upper housing;
a circuit board located in the cooling chamber;
a fixed device which is located inside the cooling chamber and is fixedly connected to the upper housing and/or the lower cover plate for fixing the circuit board; and
a sealing component which comprises a sealing ring and a sealing sleeve for sealing the cooling chamber, wherein the sealing ring is located between the upper housing and the lower cover plate, the sealing sleeve is located between the circuit board and the lower cover plate, wherein:
the fixed device comprises an upper housing connector, a lower housing connector and a circuit board connector; one end of the upper housing connector is fixedly connected with the upper housing, the other end of the upper housing connector is fixedly connected with one end of the circuit board connector; one end of the lower cover plate connector is fixedly connected with the lower cover plate, the other end of the lower cover plate is connected with the other end of the circuit board connector.

12. The cooling mechanism, as recited in claim 11, wherein the upper housing is a semi-enclosed structure, multiple screw hole columns are located inside the upper housing.

13. The cooling mechanism, as recited in claim 12, wherein the lower cover plate has screw holes, the lower cover plate has an accommodating hole.

14. The cooling mechanism, as recited in claim 13, wherein the fasteners are screws, the screws respectively match with the screw hole columns and the screw holes, the screws respectively pass through the screw holes to be fixedly connect with the screw hole columns, so as to tightly fix the lower cover plate to the upper housing.

15. The cooling mechanism, as recited in claim 11, wherein a fixed connecting component is located at the bottom surface of the lower cover plate for connecting the cooling mechanism to an interior of a gimbal.

16. The cooling mechanism, as recited in claim 11, wherein the cooling liquid is an insulating liquid.

17. The cooling mechanism, as recited in claim 11, wherein a volume of the cooling liquid is 70%-100% of a volume of the cooling chamber.

18. The cooling mechanism, as recited in claim 11, wherein a bottom area of the upper housing is as same as or similar to an area of the lower cover plate.

\* \* \* \* \*